US012221574B2

(12) United States Patent
Kuwabata et al.

(10) Patent No.: US 12,221,574 B2
(45) Date of Patent: Feb. 11, 2025

(54) CORE-SHELL SEMICONDUCTOR NANOPARTICLES, PRODUCTION METHOD THEREOF, AND LIGHT-EMITTING DEVICE

(71) Applicants: OSAKA UNIVERSITY, Osaka (JP); National University Corporation Tokai National Higher Education and Research System, Nagoya (JP); NICHIA CORPORATION, Anan (JP)

(72) Inventors: Susumu Kuwabata, Ibaraki (JP); Taro Uematsu, Suita (JP); Kazutaka Wajima, Toyonaka (JP); Tsukasa Torimoto, Nagoya (JP); Tatsuya Kameyama, Nagoya (JP); Daisuke Oyamatsu, Tokushima (JP)

(73) Assignees: OSAKA UNIVERSITY, Osaka (JP); National University Coporation Tokai National Higher Education and Research System, Nagoya (JP); NICHIA CORPORATION, Anan (JP)

( * ) Notice: Subject to any disclaimer, the term of this patent is extended or adjusted under 35 U.S.C. 154(b) by 0 days.

(21) Appl. No.: 16/970,273

(22) PCT Filed: Feb. 15, 2019

(86) PCT No.: PCT/JP2019/005610
§ 371 (c)(1),
(2) Date: Aug. 14, 2020

(87) PCT Pub. No.: WO2019/160093
PCT Pub. Date: Aug. 22, 2019

(65) Prior Publication Data
US 2021/0040385 A1 Feb. 11, 2021

(30) Foreign Application Priority Data
Feb. 15, 2018 (JP) ................................ 2018-025409

(51) Int. Cl.
*C09K 11/62* (2006.01)
*B82Y 20/00* (2011.01)
(Continued)

(52) U.S. Cl.
CPC .......... *C09K 11/621* (2013.01); *H01L 33/502* (2013.01); *B82Y 20/00* (2013.01); *B82Y 40/00* (2013.01)

(58) Field of Classification Search
CPC ....... C09K 11/621; C09K 11/08; C09K 11/62; C09K 11/64; C09K 11/88; H01L 33/502;
(Continued)

(56) References Cited

U.S. PATENT DOCUMENTS 7,282,710 B1 * 10/2007 Black ..................... G01Q 70/14
427/256
10,870,797 B2 * 12/2020 Torimoto .............. H01L 33/502
(Continued)

FOREIGN PATENT DOCUMENTS

| CN | 101815774 A | 8/2010 |
|----|-------------|--------|
| CN | 104371704 A | 2/2015 |

(Continued)

OTHER PUBLICATIONS

Aug. 2017, 8p-A414-6, (Kuwabata, Susumu et al. Band-edge photoluminescence from AgInS2 colloidal quantum dots by the formation of III-VI semiconductor shells. Proceedings of the 78th JSAP Autumn Meeting.*
(Continued)

*Primary Examiner* — Edward Chin
(74) *Attorney, Agent, or Firm* — Hunton Andrews Kurth LLP

(57) ABSTRACT

Provided are core-shell semiconductor nanoparticles, each including a core and a shell disposed on a surface of the core, and emitting light when irradiated with light. The core
(Continued)

contains a semiconductor containing $M^1$, $M^2$, and Z, $M^1$ containing at least one selected from the group consisting of Ag, Cu, and Au, $M^2$ containing at least one selected from the group consisting of Al, Ga, In, and Tl, and Z containing at least one selected from the group consisting of S, Se, and Te. The shell contains a semiconductor containing a Group 13 element and a Group 16 element, and having a greater band-gap energy than the core. The shell has a compound containing a Group 15 element disposed on a surface of the shell, and the Group 15 element containing at least P with a negative oxidation number.

14 Claims, 4 Drawing Sheets

(51) Int. Cl.
    *B82Y 40/00*     (2011.01)
    *H01L 33/50*     (2010.01)

(58) Field of Classification Search
    CPC ....... H01L 2933/0041; H01L 21/02601; H01L 31/035218; B82Y 20/00; B82Y 40/00; B82Y 30/00; C01G 15/00
    See application file for complete search history.

(56) References Cited

U.S. PATENT DOCUMENTS

| | | | |
|---|---|---|---|
| 2007/0077594 A1 | 4/2007 | Hikmet et al. | |
| 2009/0203838 A1* | 8/2009 | Koch | C08F 2/44 524/588 |
| 2010/0159248 A1* | 6/2010 | Jang | C09K 11/70 977/774 |
| 2010/0193806 A1 | 8/2010 | Byun | |
| 2010/0270504 A1* | 10/2010 | Qu | C09K 11/565 252/301.36 |
| 2010/0283005 A1 | 11/2010 | Pickett et al. | |
| 2011/0315954 A1* | 12/2011 | Jang | B82Y 40/00 977/773 |
| 2013/0115455 A1 | 5/2013 | Banin et al. | |
| 2013/0186466 A1* | 7/2013 | Hebrink | B82Y 30/00 136/256 |
| 2014/0312286 A1* | 10/2014 | Kamplain | C09K 11/70 252/519.4 |
| 2016/0115378 A1 | 4/2016 | Ezure | |
| 2016/0280991 A1* | 9/2016 | Chevallier | C09K 11/584 |
| 2016/0357039 A1* | 12/2016 | Kim | G02F 1/133621 |
| 2017/0186909 A1 | 6/2017 | Kim et al. | |
| 2017/0267924 A1* | 9/2017 | Kuwabata | C09B 67/0097 |
| 2018/0066183 A1 | 3/2018 | Torimoto et al. | |
| 2019/0264103 A1* | 8/2019 | Ono | C09K 11/08 |
| 2019/0345384 A1* | 11/2019 | Torimoto | C09K 11/881 |
| 2020/0006601 A1* | 1/2020 | Torimoto | H01L 33/502 |
| 2021/0343908 A1* | 11/2021 | Torimoto | H01L 33/06 |

FOREIGN PATENT DOCUMENTS

| | | | | |
|---|---|---|---|---|
| CN | 105264042 A | * | 1/2016 | ............ C09K 11/02 |
| CN | 106935717 A | | 7/2017 | |
| CN | 107983272 A | * | 5/2018 | ............ B01J 13/02 |
| JP | 2007513478 A | | 5/2007 | |
| JP | 2010177656 A | | 8/2010 | |
| JP | 2012212862 A | | 11/2012 | |
| JP | 2013539798 A | | 10/2013 | |
| JP | 2014169421 A | | 9/2014 | |
| JP | 2016196631 A | | 11/2016 | |
| JP | 2018039971 A | | 3/2018 | |
| JP | 2018044142 A | | 3/2018 | |
| KR | 20180105873 A | * | 3/2017 | |
| WO | 2009016354 A1 | | 2/2009 | |
| WO | 2014129067 A1 | | 8/2014 | |
| WO | 2018159699 A1 | | 9/2018 | |
| WO | WO-2020138124 A1 | * | 7/2020 | ............ C09K 11/565 |

OTHER PUBLICATIONS

Aug. 2017, 8p-A414-6, (Kuwabata, Susumu et al. Band-edge photoluminescence from AgInS2 colloidal quantum dots by the formation of III-VI semiconductor shells. Proceedings of the 78th JSAP Autumn Meeting (Year: 2017).*

International Search Report based on International Application No. PCT/JP2019/005610 mailed Dec. 3, 2019, 5 pages.

Kuwabata, Susumu, et al., Band-edge photoluminescence from AgInS2 colloidal quantum dots by the formation of II-VI semiconductor shells, (2017), 3 pages.

Kameyama, Tatsuya, et al., Wavelength-Tunable Band-Edge Photoluminescence of Nonstoichiometric Ag—In—S Nanoparticles via Ga3+ Doping, ACS Applied Materials & Interfaces, Dec. 3, 2018, vol. 10, pp. 42844-42855, 12 pages.

Uematsu, Taro, et al., Narrow band-edge photoluminescence from AgInS2 semiconductor nanoparticles by the formation of amorphous III-VI semiconductor shells, NPG Asia Materials, Aug. 7, 2018, vol. 10, 713-726, 14 pages.

* cited by examiner

CORE-SHELL SEMICONDUCTOR NANOPARTICLES, PRODUCTION METHOD THEREOF, AND LIGHT-EMITTING DEVICE

CROSS-REFERENCE TO RELATED APPLICATION

This application is a national phase application based on International Patent Application No. PCT/JP/2019/005610 filed Feb. 15, 2019, which claims priority to Japan Patent Application No. 2018-025409 filed on Feb. 15, 2018, which are all incorporated herein by reference in their entirety.

TECHNICAL FIELD

The present disclosure relates to core-shell semiconductor nanoparticles, a production method thereof, and a light-emitting device.

BACKGROUND ART

Semiconductor particles with a particle diameter of, for example, 10 nm or less are known to exhibit a quantum size effect, and such nanoparticles are referred to as "quantum dots" (also referred to as "semiconductor quantum dots"). Quantum size effect is a phenomenon where a valence band and a conduction band, each of which is regarded as continuous in bulk particles, become discrete when the particle diameter is on the nanoscale, and the band-gap energy varies in accordance with their particle diameters.

Quantum dots absorb light and change the wavelength of the light corresponding to their band-gap energy. Thus, white light-emitting devices using emission of quantum dots are proposed (refer to, for example, Japanese Unexamined Patent Application Publications No. 2012-212862 and No. 2010-177656). More specifically, light emitted from a light-emitting diode (LED) chip is partially absorbed by quantum dots, and the emission from the quantum dots and the light from the LED chip are mixed to produce white light. In these patent application documents, use of Group 12-Group 16 binary quantum dots, such as CdSe or CdTe, or Group 14-Group 16 binary quantum dots, such as PbS or PbSe, is proposed. Also, a wavelength conversion film containing core-shell-structured semiconductor quantum dots not containing Cd nor Pb in consideration of the toxicity of compounds containing these elements is proposed (refer to, for example, International Patent Publication No. WO 2014-129067). Further, a process for increasing the photoluminescence internal quantum efficiency of $AgInS_2$—ZnS nanocrystals is proposed (refer to, for example, Japanese Unexamined Patent Application Publication No. 2016/196631). The process described in Japanese Unexamined Patent Application Publication No. 2016/196631 is for increasing internal quantum yield in defect emission, and not for increasing quantum yield in band-edge emission.

SUMMARY OF THE INVENTION

Problems to be Solved by the Invention

An aspect of the present disclosure is directed to providing core-shell semiconductor nanoparticles that exhibit a band-edge emission, and are superior in quantum yield.

Means for Solving the Problem

A first aspect of the present disclosure is directed to core-shell semiconductor nanoparticles that emits light when irradiated with light, the core-shell semiconductor nanoparticles each including a core and a shell disposed on the surface of the core. The core may contain a semiconductor containing $M^1$, $M^2$, and Z, where $M^1$ may contain at least one element selected from the group consisting of silver (Ag), copper (Cu), and gold (Au), $M^2$ may contain at least one element selected from the group consisting of aluminum (Al), gallium (Ga), indium (In), and thallium (Tl), and Z may contain at least one element selected from the group consisting of sulfur (S), selenium (Se), and tellurium (Te). The shell may contain a semiconductor containing a Group 13 element and a Group 16 element, and having a greater band-gap energy than the core, and a compound containing a Group 15 element may be disposed on the surface of the shell. The Group 15 element may contain at least phosphorus (P) with a negative oxidation number.

A second aspect is directed to a light-emitting device including a light conversion member containing the core-shell semiconductor nanoparticles, and a semiconductor light-emitting element.

A third aspect is directed to a method of producing core-shell semiconductor nanoparticles that emit light when irradiated with light. The method may include providing core-shell particles each including a core and a shell disposed on the surface of the core; and contacting the core-shell particles and a compound containing a Group 15 element. The core may contain a semiconductor containing $M^1$, $M^2$, and Z. In certain embodiment(s), $M^1$ contains at least one selected from the group consisting of Ag, Cu, and Au, $M^2$ contains at least one selected from the group consisting of Al, Ga, In, and Tl, and Z contains at least one selected from the group consisting of S, Se, and Te. The shell may contain a semiconductor containing a Group 13 element and a Group 16 element, and having a greater band-gap energy than the core. The Group 15 element may contain at least phosphorus (P) with a negative oxidation number.

Advantageous Effect of the Invention

According to an aspect of the present disclosure, core-shell semiconductor nanoparticles that exhibit a band-edge emission, and are superior in quantum yield can be provided.

MODE FOR CARRYING OUT THE INVENTION

Figure 1:
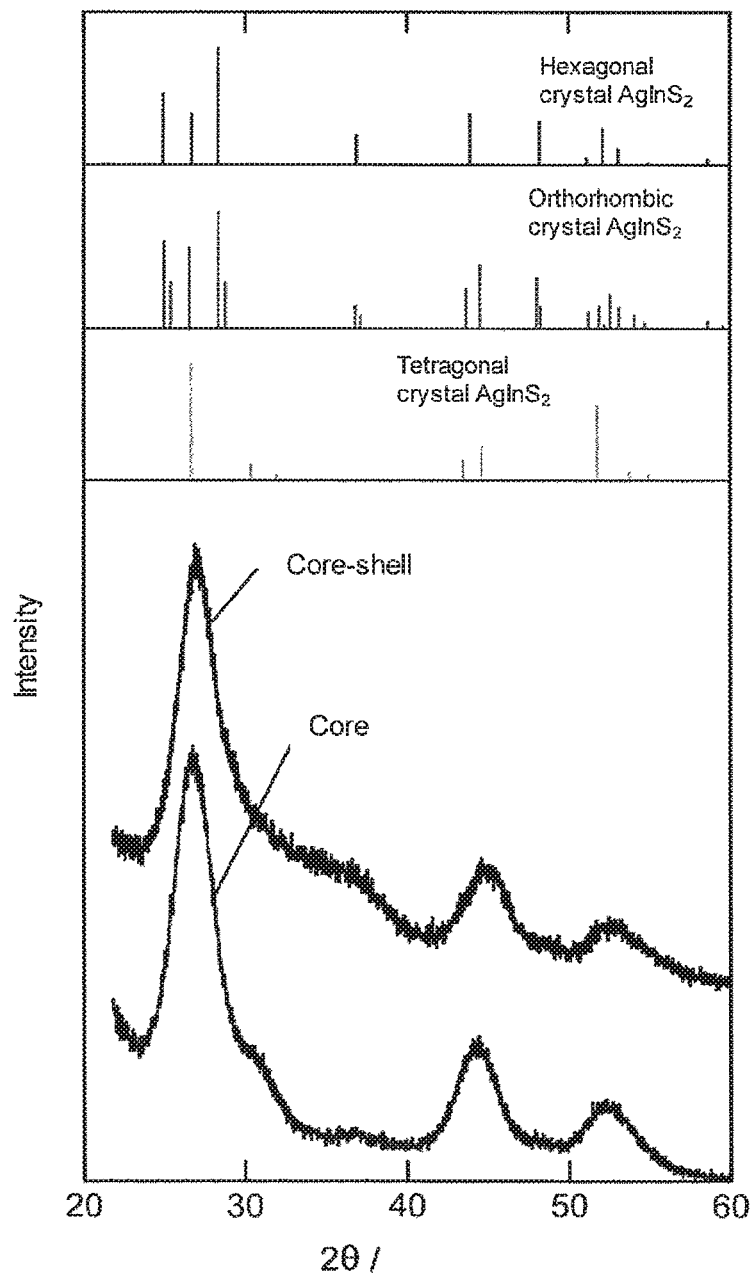
FIG. 1 shows XRD patterns of the semiconductor nanoparticles (core) and the core-shell semiconductor nanoparticles (core-shell) produced in Example 1.

As used herein, the term "step" means not only an independent step but also a step which cannot be clearly distinguished from the other steps but that can achieve the desired object. When a plurality of substances corresponding to a component are present in a composition, the amount of the component means the total amount of the corresponding substances present in the composition unless otherwise specified. The embodiments will now be described in detail. However, the embodiments shown below are mere examples of the core-shell semiconductor nanoparticles, the production method thereof, and the light-emitting device for embodying the technical concept of the present invention, and the present invention is not limited to the core-shell semiconductor nanoparticles, the production method thereof, and the light-emitting device described below.

Core-Shell Semiconductor Nanoparticles

According to the first aspect of the present disclosure, the core-shell semiconductor nanoparticles are core-shell semiconductor nanoparticles each containing a core and a shell disposed on the surface of the core, and emitting light when irradiated with light. The core may contain a semiconductor containing $M^1$, $M^2$, and Z. In the semiconductor, $M^1$ may contain at least one selected from the group consisting of Ag, Cu, and Au, $M^2$ may contain at least one selected from the group consisting of Al, Ga, In, and Tl, and Z may contain at least one selected from the group consisting of S, Se, and Te. The shell may contain a semiconductor containing a Group 13 element and a Group 16 element, and having a greater band-gap energy than the core. On the surface of the shell, a compound containing a Group 15 element may be disposed, and the Group 15 element may contain at least P with a negative oxidation number.

With a compound containing phosphorus (P) having a negative oxidation number being disposed on the shell surface of the core-shell semiconductor nanoparticles, each of which includes a core formed from specific constituent elements and a shell containing Group 13 and 16 elements, and which exhibit a band-edge emission, the core-shell semiconductor nanoparticles can exhibit a band-edge emission with an improved quantum yield. This is probably because, for example, the compound containing a specific phosphorus compensates defects on the shells of the core-shell semiconductor nanoparticles.

Core

The core of the core-shell semiconductor nanoparticles may contain a ternary semiconductor containing $M^1$, $M^2$, and Z. The core may have at least one crystal structure selected from the group consisting of tetragonal, hexagonal, and orthorhombic crystals. Here, $M^1$ may contain at least one element selected from the group consisting of Ag, Cu, and Au, preferably contains at least either Ag or Cu, and more preferably contains Ag. $M^1$ containing Ag tends to facilitate synthesis of the core (corresponding to the semiconductor nanoparticles to be produced in the production method described later). The core may contain two or more elements as $M^1$.

$M^2$ may contain at least one element selected from the group consisting of Al, Ga, In, and Tl, preferably contains at least either In or Ga, and more preferably contains In. In, which is less likely to produce by-products, is preferably used. The core may contain two or more elements as $M^2$. The semiconductor that forms the core may contain, for example, Ga and In as $M^2$.

Z may contain at least one element selected from the group consisting of S, Se, and Te, and preferably contains S. The core in which Z contains S has a broader band gap than the semiconductor in which Z is Se or Te, and thus the core is likely to emit light in the visible light region. The core may contain two or more elements as Z.

Examples of the combinations of $M^1$, $M^2$, and Z ($M^1$/$M^2$/Z) include Cu/In/S, Ag/In/S, Ag/(In, Ga)/S, Ag/In/Se, and Ag/Ga/S.

Semiconductors containing the above-described specific elements and having a tetragonal, hexagonal, orthorhombic crystal structure typically have a composition represented by $M^1M^2Z_2$. Among the semiconductors having a composition represented by $M^1M^2Z_2$, those having a hexagonal crystal structure are wurtzite-type, and those having a tetragonal crystal structure are chalcopyrite-type. A crystal structure is identified by, for example, measuring an X-ray diffraction (XRD) pattern obtained by XRD analysis. Specifically, an XRD pattern obtained from a core is compared with the XRD patterns known as those of the semiconductor nanoparticles represented by the composition $M^1M^2Z_2$, or XRD patterns obtained through simulation using crystal structure parameters. If there is a pattern among the known patterns and the simulated patterns that corresponds to the pattern of the core, the semiconductor nanoparticles have a crystal structure of the pattern of the corresponding known or simulated pattern.

In an aggregate of the semiconductor nanoparticles, a plurality of different types of the semiconductor nanoparticles with different core crystal structures may be mixed. In that case, peaks derived from the plurality of crystal structures are observed in the XRD pattern.

A core containing a ternary semiconductor may not actually have a stoichiometric composition represented by the above general formula, and may have, in particular, a ratio of the atomic number of $M^1$ to the atomic number of M2 ($M^1/M^2$)$_{of}$ less than 1, or conversely, greater than 1. Also, the sum of the atomic number of $M^1$ and the atomic number of $M^2$ may not be equal to the atomic number of Z. In the semiconductor nanoparticles of the present embodiment, the core formed from a ternary semiconductor may be formed from a semiconductor having such a nonstoichiometric composition. In the present specification, the composition of the semiconductors containing specific elements is represented by $M^1$-$M^2$-Z by connecting the constituent elements with "—" in the situation where whether the composition is stoichiometric or not is irrelevant.

The core may be essentially composed only of $M^1$, $M^2$, and Z. Here, the term "essentially" is used considering unavoidable inclusion of other elements than $M^1$, $M^2$, and Z due to, for example, contamination of impurities.

The core may contain other elements. For example, $M^2$ may be partially replaced by other metal elements. The other metal elements may be those that turn into positive trivalent metal ions, and specifically at least one selected from the group consisting of Cr, Fe, Al, Y, Sc, La, V, Mn, Co, Ni, Ga, In, Rh, Ru, Mo, Nb, W, Bi, As, and Sb. The replacement amount is preferably 10% or less when the number of atoms including the other metal elements to replace $M^2$ is 100%.

Shell

The shell may be formed from a semiconductor containing Group 13 and 16 elements and having a greater band-gap energy than the semiconductor forming the core. Examples of the Group 13 element include B, Al, Ga, In, and Tl, and examples of the Group 16 element include O, S, Se, Te, and Po. The semiconductor forming the shell may contain a single or two or more Group 13 elements, and a single or two or more Group 16 elements.

The shell may be formed from a semiconductor essentially composed of Group 13 and 16 elements. Here, "essentially" indicates that the other elements than Group 13 and 16 elements are contained at a rate of, for example, 10% or less, preferably 5% or less, and more preferably 1% or less when the total atomic number of all the elements contained in the shell is 100%.

The band-gap energy of the core semiconductor varies depending on the composition, and a Group 11-13-16 ternary semiconductor typically has a band-gap energy of from 1.0 eV to 3.5 eV, and particularly a Ag—In—S semiconductor has a band-gap energy of from 1.8 eV to 1.9 eV. Thus, the shell may be formed by selecting the composition and others in accordance with the band-gap energy of the core semiconductor. Alternatively, when the shell has a predetermined composition and others, the core may be designed such that the core semiconductor has a band-gap energy smaller than that of the shell.

Specifically, the shell semiconductor may have a band-gap energy of, for example, from 2.0 eV to 5.0 eV, and particularly from 2.5 eV to 5.0 eV. The shell may have a band-gap energy greater than the band-gap energy of the core by, for example, from about 0.1 eV to 3.0 eV, particularly from about 0.3 eV to 3.0 eV, and more particularly from about 0.5 eV to 1.0 eV. When the difference between the band-gap energy of the shell semiconductor and the band-gap energy of the core semiconductor is not less than the lower limit, light emission from the core other than its band-edge emission tends to be smaller in ratio, resulting in a greater band-edge emission ratio.

The band gap energies of the semiconductors forming the core and the shell are preferably selected to form a type-I band alignment where the core band gap energy exists between the shell band gap energy at the heterojunction of the core and the shell. The type-I band alignment enables a further satisfactory band-edge emission from the core. In the type-I alignment, at least 0.1 eV barrier is preferably formed, and particularly 0.2 eV or more, and more particularly 0.3 eV or more barrier may be formed between the core band gap and the shell band gap. The upper limit of the barrier is, for example, 1.8 eV or less, and particularly 1.1 eV or less. With the barrier not less than the lower limit, light emission from the core other than its band-edge emission tends to be smaller in ratio, resulting in a greater band-edge emission ratio.

The shell semiconductor may contain In or Ga as a Group 13 element. The shell may also contain S as a Group 16 element. The semiconductor containing In or Ga, or S tends to have a greater band-gap energy than the Group 11-13-16 ternary semiconductor.

The shell semiconductor may have a crystal system in accord with the crystal system of the core semiconductor, and have a lattice constant the same as or close to the lattice constant of the core semiconductor. The shell formed from a semiconductor with a crystal system in accord with the crystal system of the core, and a lattice constant close to the lattice constant of the core (including a shell lattice constant close to the core lattice constant when multiplied) can cover the periphery of the core satisfactorily For example, Ag—In—S, which is a Group 11-13-16 ternary semiconductor, is typically tetragonal, and examples of the crystal system in accord with this include tetragonal and orthorhombic crystals. An Ag—In—S semiconductor with a tetragonal crystal system has lattice constants of 5.828 Å (0.5828 nm), 5.828 Å (0.5828 nm), and 11.19 Å (1.119 nm). The shell covering this core preferably has a tetragonal or cubic crystal system with lattice constants or their multiples close to the lattice constants of Ag—In—S semiconductor. Alternatively, the shell may be amorphous.

Whether an amorphous shell is formed may be checked by observing the core-shell semiconductor nanoparticles using an HAADF-STEM. Specifically, if an amorphous shell is formed, an area with a regular pattern (e.g., stripes or dots) is observed in the center, and an area with no regular pattern is observed in the periphery through an HAADF-STEM. An HAADF-STEM shows an image with a regular pattern for a substance with a regular structure like a crystal substance, and an image with no regular pattern for a substance with no regular structure like an amorphous substance. Thus, an amorphous shell can be observed as an area clearly distinct from the core, which is shown as an image with a regular pattern (with a crystal structure such as a tetragonal crystal system as described above).

When the core is formed from Ag—In—S, and the shell is formed from GaS, the shell is likely shown as a darker area than the core area in an image obtained through an HAADF-STEM because Ga is a lighter element than Ag and In.

Whether an amorphous shell is formed may also be checked by observing the core-shell semiconductor nanoparticles according to the present embodiment through a high-resolution transmission electron microscope (HRTEM). In the image obtained through an HRTEM, the core area is observed as a crystal lattice image (an image with a regular pattern), and the shell area is not observed as a crystal lattice image, but as an area of mere black and white contrast with no regular pattern.

The shell preferably forms no solid solution with the core. If the shell forms a solid solution with the core, the two forms a single body. This may ruin the mechanism of the present embodiment where the core is covered with the shell to change the surface state of the core and obtain a band-edge emission. For example, no band-edge emission has been confirmed to be obtained from Ag—In—S core when the surface of the core is covered with zinc sulfide (Zn—S) having a stoichiometric composition or a nonstoichiometric composition. Zn—S satisfies the above requirements of band-gap energy in the relationship with Ag—In—S, and gives a type-I band alignment. Nevertheless, no band-edge emission was obtained from the specific semiconductor. This is probably because the specific semiconductor and ZnS formed a solid solution, which eliminated the interface between the core and the shell.

The shell may contain, for a combination of Group 13 and 16 elements, a combination of In and S, a combination of Ga and S, or a combination of In, Ga, and S, but these are not limitative. The combination of In and S may take a form of indium sulfide, the combination of Ga and S may take a form of gallium sulfide, and the combination of In, Ga, and S may be gallium indium sulfide. The indium sulfide forming the shell may not have a stoichiometric composition ($In_2S_3$). In this sense, indium sulfide may be represented by formula $InS_x$ (where x is not necessarily an integer but may be any number, for example, from 0.8 to 1.5) in the present specification. Similarly, gallium sulfide may not have a stoichiometric composition ($Ga_2S_3$), and in this sense, gallium sulfide may be represented by formula $GaS_x$ (where x is not necessarily an integer but may be any number, for example, from 0.8 to 1.5) in the present specification. Gallium indium sulfide may have a composition represented by $In_{2(1-y)}$ Ga$_{2y}$S$_3$ (where y is any number greater than 0 and less than 1), or represented by In$_a$Ga$_{1-a}$S$_b$ (where a is any number greater than 0 and less than 1, and b is not necessarily an integer but may be any numerical value).

Indium sulfide having a cubic crystal system and a band gap energy of from 2.0 eV to 2.4 eV has a lattice constant of 1.0775 nm (10.775 Å). Gallium sulfide having a tetragonal crystal system and a band gap energy of from about 2.5 eV to 2.6 eV has a lattice constant of 5.215 Å (0.5215 nm). However, these crystal systems and others are reported values, and the actual core-shell semiconductor nanoparticles may have a shell not satisfying these reported values.

Indium sulfide and gallium sulfide are preferably used as a semiconductor forming a shell when the core is a Group 11-13-16 ternary semiconductor, particularly Ag—In—S. In particular, gallium sulfide, which has a greater band-gap energy, is preferably used. When gallium sulfide is used, a stronger band-edge emission can be exhibited than when indium sulfide is used.

Surface Modifier

The shell may be surface-modified with a compound containing a Group 15 element including P with a negative oxidation number (hereinafter, also referred to as specific modifier). A shell surface modifier containing the specific modifier enables the core-shell semiconductor nanoparticles to have a band-edge emission with an improved quantum yield.

The specific modifier contains P with a negative oxidation number as the Group 15 element. The oxidation number of P changes to −1 when a single hydrogen atom or a single hydrocarbon group binds to P, whereas the oxidation number of P changes to +1 when an oxygen atom binds to P through a single bond; thus, the oxidation number of P varies depending on the substitution state of P. For example, the oxidation number of P is −3 in trialkylphosphine and triarylphosphine, and is −1 in trialkylphosphine oxide and triarylphosphine oxide.

The specific modifier may contain, in addition to P with a negative oxidation number, other Group 15 elements. Examples of the other Group 15 elements include N, As, and Sb.

The specific modifier may be, for example, a phosphorus-containing compound having a hydrocarbon group with a carbon number of from 4 to 20. Examples of hydrocarbon groups with a carbon number of from 4 to 20 include straight or branched saturated aliphatic hydrocarbon groups, such as n-butyl, isobutyl, n-pentyl, n-hexyl, octyl, ethylhexyl, decyl, dodecyl, tetradecyl, hexadecyl, and octadecyl; straight or branched unsaturated aliphatic hydrocarbon groups, such as oleyl; alicyclic hydrocarbon groups, such as cyclopentyl and cyclohexyl; aromatic hydrocarbon groups, such as phenyl and naphthyl; and arylalkyl groups, such as benzyl and naphthyl methyl. Of these, saturated aliphatic hydrocarbon groups and unsaturated aliphatic hydrocarbon groups are preferable. When the specific modifier has a plurality of hydrocarbon groups, they may be the same or different.

Specific examples of the specific modifier include tributylphosphine, triisobutylphosphine, tripentylphosphine, trihexylphosphine, trioctylphosphine, tris(ethylhexyl)phosphine, tridecylphosphine, tridodecylphosphine, tritetradecylphosphine, trihexadecylphosphine, trioctadecylphosphine, triphenylphosphine, tributylphosphine oxide, triisobutylphosphine oxide, tripentylphosphine oxide, trihexylphosphine oxide, trioctylphosphine oxide, tris(ethylhexyl)phosphine oxide, tridecylphosphine oxide, tridodecylphosphine oxide, tritetradecylphosphine oxide, trihexadecylphosphine oxide, trioctadecylphosphine oxide, and triphenylphosphine oxide, and at least one selected from the group consisting of these is preferable.

The shell surface may be surface-modified with other surface modifiers in addition to the specific modifier. Examples of the other surface modifiers include nitrogen-containing compounds having a hydrocarbon group with a carbon number of from 4 to 20, sulfur-containing compounds having a hydrocarbon group with a carbon number of from 4 to 20, and oxygen-containing compounds having a hydrocarbon group with a carbon number of from 4 to 20. Examples of the nitrogen-containing compounds include amines and amides, examples of the sulfur-containing compounds include thiols, and examples of the oxygen-containing compounds include aliphatic acids.

The other surface modifiers are preferably nitrogen-containing compounds having a hydrocarbon group with a carbon number of from 4 to 20, and sulfur-containing compounds having a hydrocarbon group with a carbon number of from 4 to 20. Examples of the nitrogen-containing compounds include alkylamines, such as n-butylamine, isobutylamine, n-pentylamine, n-hexylamine, octylamine, decylamine, dodecylamine, tetradecylamine, hexadecylamine, and octadecylamine, and alkenylamine, such as oleylamine. In particular, n-tetradecylamine is preferable because it has a boiling point of above 290° C. and highly pure one is easily available. Examples of the sulfur-containing compounds include n-butanethiol, isobutanethiol, n-pentanethiol, n-hexanethiol, octanethiol, decanethiol, dodecanethiol, hexadecanethiol, and octadecanethiol.

For the surface modifier, two or more different ones may be used in combination. For example, a compound selected from the above-listed nitrogen-containing compounds (for example, oleylamine) and a compound selected from the above-listed sulfur-containing compound (for example, dodecanethiol) may be used in combination.

Core-Shell Structure

The core-shell semiconductor nanoparticles, when irradiated with light, such as ultraviolet light, visible light, or infrared rays, emit light with a longer wavelength than the irradiated light. Specifically, when irradiated with ultraviolet light, visible light, or infrared rays, the core-shell semiconductor nanoparticles can emit light having a longer wavelength than the irradiated light, with the main component having an emission lifetime of 200 ns or less and/or an emission spectrum having a half-bandwidth of 70 nm or less. Further, the shell surface containing elements of specific groups being modified with the specific modifier enables a band-edge emission with an improved quantum yield.

The core-shell semiconductor nanoparticles may have an average particle diameter of, for example, 50 nm or less. The average particle diameter may be within the range of from 1 nm to 20 nm, and particularly within the range of from 1 nm to 10 nm.

The average particle diameter of the nanoparticles may be obtained, for example, from an image captured using a transmission electron microscope (TEM). The particle diameter of the nanoparticles specifically refers to the length of the longest line segment among the line segments connecting any two points on the periphery of the particle and lying inside the particles observed in a TEM image.

However, for a rod-shaped particle, the length of the short axis is defined as the particle diameter. A rod-shaped particle is a particle having a short axis and a long axis orthogonal to the short axis with a ratio of the long axis to the short axis of greater than 1.2 in a TEM image. Examples of the rod-shaped particles include tetragonal (including rectangular), elliptical, and polygonal particles observed in a TEM image. The rod-shaped particles may have a cross-section, which is a plane orthogonal to the long axis, with, for example, a circular, elliptical, or polygonal shape. Specifically, for a rod-shaped particle with an elliptical cross-section, the length of the long axis is the longest line segment among the line segments connecting any two points on the periphery of the particle. For a rod-shaped particle with a rectangular or polygonal cross-section, the length of the long axis is the longest line segment among the line segments parallel to the longest side among the sides defining the periphery and connecting any two points on the periphery of the particle. The length of the short axis is the longest line segment among the line segments connecting any two points on the periphery of the particle and orthogonal to the line segment defining the length of the long axis.

The average particle diameter of the core-shell semiconductor nanoparticles may be determined by measuring the particle diameters of all the measurable particles observed in a TEM image captured with a magnification of from 50,000 to 150,000×, and averaging the measured particle diameters. The "measurable" particles as used herein refers to particles entirely observable in a TEM image. Thus, in a TEM image, particles partially not contained in the captured area and observed as partially "cut" particles are not measurable. When a TEM image contains 100 or more measurable particles, their average particle diameter is obtained using the TEM image. When a TEM image contains less than 100 measurable particles, another TEM image is captured in a different site of the particles, and an average particle diameter is obtained by measuring and averaging the particle diameters of 100 or more measurable particles using the two or more TEM images.

In the core-shell semiconductor nanoparticles, the core may have an average particle diameter of, for example, 10 nm or less, and particularly 8 nm or less. The core may have an average particle diameter within the range of from 2 nm to 10 nm, and particularly within the range of from 2 nm to 8 nm. With the core having an average particle diameter within the above range, a quantum size effect is more easily obtained, and a band-edge emission is more easily obtained.

The shell may have a shell thickness within the range of from 0.1 nm to 50 nm, within the range of from 0.1 nm to 10 nm, and particularly within the range of from 0.3 nm to 3 nm. With the shell thickness within the above range, the effect resulting from the shell covering the core is satisfactorily achieved, and a band-edge emission is more easily obtained.

The average particle diameter of the core and the thickness of the shell may be obtained by observing the core-shell semiconductor nanoparticles, for example, through an HAADF-STEM. In particular, when the shell is amorphous, the shell can be easily observed as an area different from the core through an HAADF-STEM, and thus the thickness of the shell can easily be obtained. In that case, the particle diameter of the core can be obtained by the technique described above for the semiconductor nanoparticles. When the thickness of the shell is not uniform, the smallest thickness is regarded as the shell thickness of that particle.

Alternatively, the average particle diameter of the core may be measured before the core is covered with the shell. The average particle diameter of the core-shell semiconductor nanoparticles is then measured, and the difference between this average particle diameter and the average particle diameter of the core measured in advance is obtained to determine the thickness of the shell.

The core-shell semiconductor nanoparticles may have a spectral emission peak with a half-bandwidth of, for example, 70 nm or less, 60 nm or less, 55 nm or less, 50 nm or less, or 40 nm or less. The lower limit of the half-bandwidth may be, for example, 10 nm or more, 20 nm or more, or 30 nm or more.

An "emission lifetime" as used herein means an emission lifetime measured using a device called a fluorescence lifetime measuring device. Specifically, the above "emission lifetime of the main component" is determined through the procedures below. First, the core-shell semiconductor nanoparticles are irradiated with excitation light to emit light, and then attenuation changes over time (afterglow) are measured for light with a wavelength near the spectral emission peak, for example, light with a wavelength within the range of the peak wavelength ±50 nm. The changes over time are started to be measured upon termination of irradiation with excitation light. The resulting attenuation curve is typically a sum of a plurality of attenuation curves derived from the relaxation processes of emission, heat, and others. Thus, in the present embodiment, assuming that three components (in other words, three attenuation curves) are contained, parameter fitting is performed such that the attenuation curve is represented by the formula below where I(t) denotes emission intensity. The parameter fitting is performed using a dedicated software.

$$I(t)=A_1\exp(-t/\tau_1)+A_2\exp(-t/\tau_2)+A_3\exp(-t/\tau_3)$$

In the formula above, $\tau_1$, $\tau_2$, and $\tau_3$ of the respective components denote the time required for the initial emission intensity to attenuate to 1/e (36.8%), each of which corresponds to the emission lifetime of each component. $\tau_1$, $\tau_2$, and $\tau_3$ are in ascending order of emission lifetime. $A_1$, $A_2$, and $A_3$ denote contribution percentages of the respective components. For example, when a component having the largest integral value of curves represented by $A_x\exp(-t/\tau_x)$ is defined as the main component, the main component has an emission lifetime $\tau$ of 200 ns or less, 100 ns or less, or 80 ns or less. Such an emission is inferred to be a band-edge emission. In identifying a main component, the value t of $A_x\exp(-t/\tau_x)$ is integrated from 0 to infinite, and the resulting $A_x\times\tau_x$ are compared, and the one with the largest value is defined as the main component.

When parameter fitting is performed assuming that the emission attenuation curve contains 3, 4, or 5 components, the differences are not that much between the respective attenuation curves drawn by the formulae obtained through parameter fitting and the actual attenuation curves. Thus, in the present embodiment, the number of components contained in the emission attenuation curve is assumed to be three to avoid complicated parameter fitting in obtaining the emission lifetime of the main component.

The emission of the core-shell semiconductor nanoparticles may include, in addition to a band-edge emission, a defect emission (for example, a donor-acceptor emission). However, the emission is preferably essentially a band-edge emission alone. A defect emission typically has a longer emission lifetime, a broader spectrum, and a peak at a longer wavelength than a band-edge emission. Essentially a band-edge emission alone as used herein means that the band-edge emission component has a purity of 40% or more, preferably 50% or more, more preferably 60% or more, and still more preferably 65% or more. The upper limit of the purity of the band-edge emission component may be, for example, 100% or less, less than 100%, or 95% or less. "The purity of a band-edge emission component" is represented by the formula below when parameter fitting is performed assuming that a band-edge emission peak and a defect emission peak each have a shape of normal distribution, and the emission spectrum is separated into two areas: a band-edge emission peak and a defect emission peak, denoted as a1 and a2, respectively.

Purity of band-edge emission component (%)=a1/(a1+a2)×100

When the emission spectrum contains no band-edge emission, in other words, when the emission spectrum contains a defect emission alone, the purity is 0%, when the spectrum contains equal peak areas of a band-edge emission and a defect emission, the purity is 50%, and when the spectrum contains a band-edge emission alone, the purity is 100%.

The quantum yield of a band-edge emission is defined as a value obtained by multiplying an internal quantum efficiency that is measured using a quantum yield measuring device at an excitation wavelength of 450 nm at a temperature of 25° C., and calculated within the range of from 506 nm to 882 nm by the above-described purity of the band-edge emission component, and dividing the product by 100. The core-shell semiconductor nanoparticles exhibit a band-edge emission with a quantum yield of, for example, 10% or more, preferably 20% or more, and more preferably 30% or more. The quantum yield may have an upper limit of, for example, 100% or less, less than 100%, or 95% or less.

The core-shell semiconductor nanoparticles having a different particle diameter can exhibit a band-edge emission with a peak at a different position. For example, when the core-shell semiconductor nanoparticles have a smaller particle diameter, the band-edge emission tends to have a peak wavelength appearing at a shorter wavelength. When the core-shell semiconductor nanoparticles have even more smaller particle diameter, the band-edge emission tends to have a smaller spectral half-bandwidth.

The core-shell semiconductor nanoparticles may have a band-edge emission with a peak wavelength of, for example, from 500 nm to 600 nm, and preferably from 510 nm to 590 nm, from 520 nm to 585 nm, or from 550 nm to 580 nm. When the semiconductor nanoparticles emit a defect emission as well, the defect emission may have a peak wavelength of, for example, from above 600 nm to 700 nm, or from 605 nm to 690 nm.

When the core-shell semiconductor nanoparticles emit a defect emission, in addition to a band-edge emission, the intensity ratio of the band-edge emission obtained from the maximum peak intensity of the band-edge emission and the maximum peak intensity of the defect emission is, for example, 0.75 or more, preferably 0.85 or more, more preferably 0.9 or more, and particularly preferably 0.93 or more, and the upper limit may be, for example, 1 or less, less than 1, or 0.99 or less. When parameter fitting is performed assuming that the band-edge emission peak and the defect emission peak each have a shape of normal distribution in an emission spectrum, separating the emission spectrum into two of the band-edge emission peak and the defect emission peak, and denoting their respective peak intensities as b1 and b2, the intensity ratio of the band-edge emission is represented by the formula below:

Intensity ratio of band-edge emission=b1/(b1+b2)

When the emission spectrum contains no band-edge emission at all, in other words, when the spectrum contains a defect emission alone, the ratio is 0, when the band-edge emission and the defect emission are equal in peak intensity, the ratio is 0.5, and when the spectrum contains a band-edge emission alone, the ratio is 1.

The core-shell semiconductor nanoparticles preferably have an absorption spectrum or an excitation spectrum (also referred to as fluorescent excitation spectrum) with an exciton peak. An exciton peak is a peak resulting from exciton formation. Particles with an exciton peak appearing in their absorption or excitation spectrum demonstrate that the particles have a small particle diameter distribution and less crystal defects, and are suitable for a band-edge emission. The sharper the exciton peak, the more particles with a uniform particle diameter and less crystal defects are contained in an aggregate of the core-shell semiconductor nanoparticles. Thus, the core-shell semiconductor nanoparticles presumably have an emission with a narrower half-bandwidth and an improved emission efficiency. The core-shell semiconductor nanoparticles of the present embodiment may have an absorption or excitation spectrum with an exciton peak observed within the range of, for example, from 350 nm to 1000 nm, and preferably 450 nm to 590 nm. In the excitation spectrum for checking the presence or absence of an exciton peak, an observation wavelength for measurement may be set around the peak wavelength.

Method of Producing Core-Shell Semiconductor Nanoparticles

The method of producing core-shell semiconductor nanoparticles that emit light when irradiated with light may include a core-shell particle providing step of providing core-shell particles each including a core and a shell disposed on the surface of the core, and a modification step of contacting the core-shell particles with a compound containing a Group 15 element. The core may contain a semiconductor containing $M^1$, $M^2$, and Z. Here, $M^1$ may contain at least one selected from the group consisting of Ag, Cu, and Au, $M^2$ may contain at least one selected from the group consisting of Al, Ga, In, and Tl, and Z may contain at least one selected from the group consisting of S, Se, and Te. The shell may contain a semiconductor containing a Group 13 element and a Group 16 element, and having a greater band-gap energy than the core. The Group 15 element contained in the compound may contain at least P with a negative oxidation number.

Contacting the core-shell particles that contain specific elements and exhibit a band-edge emission by themselves with a specific modifier containing a Group 15 element to modify the shell surfaces enables efficient production of core-shell semiconductor nanoparticles that exhibit a band-edge emission with an improved quantum yield. However, no effect of improving quantum yield can be obtained by modifying semiconductor nanoparticles composed of cores alone with the specific modifier. Also, no effect of improving quantum yield can be obtained by modifying core-shell particles with shells containing elements other than the specific elements. Thus, the effect of improving quantum yield by the specific modifier is believed to be specific to the core-shell nanoparticles that have shells containing the specific elements, and exhibit a band-edge emission.

Core-Shell Particle Providing Step

The core-shell particle providing step may include a core preparation step of preparing a fluid dispersion in which semiconductor nanoparticles that serve as the cores are dispersed in a solvent, and a shell formation step including adding to the fluid dispersion a compound containing a Group 13 element that serves as a source of the Group 13 element, and a Group 16 element in the form of a single substance or a compound containing the Group 16 element that serves as a source of the Group 16 element to form a semiconductor layer essentially composed of the Group 13 element and the Group 16 element on the surfaces of the semiconductor nanoparticles.

Core Preparation Step

In the core preparation step, a fluid dispersion of the semiconductor nanoparticles may be prepared. The semiconductor nanoparticles may be nanoparticles formed from a semiconductor containing $M^1$, $M^2$, and Z. For the semiconductor nanoparticles, those commercially available may be used as they are, or, if any, those produced on a trial basis may be used, or the nanoparticles may be prepared by reacting an $M^1$ source, an $M^2$ source, and a Z source. In the core-shell preparation step, the semiconductor nanoparticles prepared in the core preparation step need not necessarily be coated with the shells immediately after the preparation, and the semiconductor nanoparticles separately prepared may be used some time later.

The semiconductor nanoparticles may be prepared, for example, by a method including mixing a salt of an element $M^1$, a salt of an element $M^2$, and a ligand having an element Z that serves as a coordination element to form a complex, and heat-treating the complex. The types of the salt of an element $M^1$ and the salt of an element $M^2$ are both not particularly limited, and they may be either an organic acid salt or an inorganic acid salt. Specifically, the salts each may be an organic acid salt, such as acetate, or an inorganic acid salt, such as nitrate, sulfate, hydrochloride, or sulfonate, and preferably an organic acid salt, such as acetate. An organic acid salt easily dissolves in an organic solvent, and can cause the reaction to proceed more uniformly.

When Z is sulfur (S), examples of the ligand having Z serving as a coordination element include β-dithiones, such as 2,4-pentanedithione; dithiols, such as 1,2-bis(trifluoromethyl)ethylene-1,2-dithiol; diethyldithiocarbamate; and thiourea.

When Z is tellurium (Te), examples of the ligand having Z serving as a coordination element include diallyltelluride and dimethyl ditelluride. When Z is selenium (Se), examples of the ligand having Z serving as a coordination element include dimethyldiselenocarbamic acid and 2-(dimethylamino)ethaneselenol.

The complex may be obtained by mixing a salt of $M^1$, a salt of $M^2$, and a ligand having Z serving as a coordination element. The complex may be formed by a method of mixing an aqueous solution of a salt of $M^1$ and a salt of $M^2$ with an aqueous solution of the ligand, or by a method of putting a salt of $M^1$, a salt of $M^2$, and the ligand into an organic solvent (in particular, an organic solvent with a high polarity, such as ethanol) and mixing them. The organic solvent may be a surface modifier, or may be a solution containing a surface modifier. The initial ratio of a salt of $M^1$, a salt of $M^2$, and a ligand having Z serving as a coordination element is preferably 1:1:2 (mole ratio) corresponding to the composition $M^1M^2Z_2$.

The complex obtained may be then heat-treated to form semiconductor nanoparticles. The heat-treatment of the complex may be carried out by precipitating and separating the complex, drying the separated complex into powder, and heating the powder at a temperature of, for example, from 100° C. to 300° C. In this case, the semiconductor nanoparticles obtained through the heat treatment is preferably further heat-treated in a surface modifier in the form of a solvent or in a solvent containing a surface modifier to allow the surfaces to be modified. Alternatively, the heat-treatment of the complex may be carried out by heating the complex obtained in the form of powder in a surface modifier in the form of a solvent or in a solvent containing a surface modifier at a temperature of, for example, from 100° C. to 300° C. Alternatively, when the complex is formed by the method of forming a complex by putting a salt of $M^1$, a salt of $M^2$ and the ligand into an organic solvent and mixing them, the formation of a complex, heat-treatment of the complex, and surface-modification may be carried out sequentially or simultaneously by putting the salts and the ligand into a surface modifier in the form of an organic solvent or in a solvent containing a surface modifier, followed by heat-treatment.

Alternatively, the semiconductor nanoparticles may be formed by putting a salt of $M^1$ and a salt of $M^2$, and a compound that serves as a supply source of Z into an organic solvent. Alternatively, the semiconductor nanoparticles may be produced by a method of reacting an organic solvent and at least one of a salt of $M^1$ and a salt of $M^2$ to form a complex, and then reacting these complexes and a compound that serves as a supply source of Z to obtain a reaction product, and heating the reaction product to grow crystals. For a salt of $M^1$ and a salt of $M^2$, the descriptions are as given above with regard to the production method including formation of a complex. Examples of the organic solvent that reacts with these salts and forms a complex may include at least one of alkylamine, alkenylamine, alkylthiol, alkenylamine, alkylphosphine, and alkenylphosphine each with a carbon number of from 4 to 20. These organic solvents may eventually modify the surfaces of the resulting semiconductor nanoparticles. These organic solvents may be used as a mixture with other organic solvents. In this production method, the initial ratio of a salt of $M^1$, a salt of $M^2$, and a compound that serves as a supply source of Z is preferably 1:1:2 (mole ratio) corresponding to the composition formula of $M^1M^2Z_2$.

Examples of the compound that serves as a supply source of Z when Z is sulfur (S) include sulfur, thiourea, thioacetamide, and alkylthiol. When Z is tellurium (Te), for example, a Te-phosphine complex obtained by heat-treating a mixture in which Te powder is added to trialkylphosphine at from 200° C. to 250° C. may be used as a compound that serves as a supply source of Z. When Z is selenium (Se), for example, a Se-phosphine complex obtained by heat-treating a mixture in which Se powder is added to trialkylphosphine at from 200° C. to 250° C. may be used as a compound that serves as a supply source of Z.

Alternatively, the semiconductor nanoparticles may be produced by the hot injection method. The hot injection method is a method of producing semiconductor nanoparticles by putting a liquid where compounds that serve as supply sources of elements for the semiconductor nanoparticles (for example, a salt of $M^1$, a salt of $M^2$, and a compound that serves as a supply source of Z (or a ligand with Z that serves as a coordination element)) are dissolved or dispersed (also referred to as a precursor solution) into a solvent that has been heated at a temperature in the range of from 100° C. to 300° C. for a relatively short time (for example, in the order of miliseconds) to generate many crystal nucleuses in the initial stage. Alternatively, in the hot injection method, a part of the compounds that serve as supply sources of the elements may be dissolved or dispersed in an organic solvent in advance and heated before the precursor solutions of other elements are put in there. Using a surface modifier as the solvent, or a solvent containing a surface modifier as the solvent allows simultaneous surface modification.

The hot injection method enables production of nanoparticles with a smaller particle diameter.

For the surface modifier that modifies the surfaces of the semiconductor nanoparticles, the descriptions are given previously with regard to the shell. When the semiconductor nanoparticles are surface-modified, particles are stabilized, and the aggregation or growth of the particles is prevented, and/or dispersibility of the particles in the solvent improves. When the semiconductor nanoparticles are surface-modified, the shells grow at the timing when the surface modifier is detached. Thus, the surface modifier modifying the semiconductor nanoparticles are not present on the surfaces of the cores, in other words, in the interfaces between the cores and the shells of the core-shell-structured nanoparticles to be eventually obtained.

In either of the production methods, the production of the semiconductor nanoparticles is carried out in an inert atmosphere, particularly in an argon atmosphere, or in a nitrogen atmosphere. This is to reduce or prevent production of an oxide as a by-product and oxidation of the surfaces of the semiconductor nanoparticles.

The semiconductor nanoparticles produced by the methods above may be separated from the solvent upon completion of the reaction, or may be further purified as appropriate. The separation is carried out following the preparation of the particles, by, for example, centrifuging the mixture solution and taking out the supernatant solution. The purification may be carried out by adding alcohol to the supernatant solution, centrifuging the mixture to cause precipitation, taking out the precipitate or removing the supernatant solution, and drying the separated precipitate by, for example, drying under reduced pressure or natural drying, or dissolving the precipitate in an organic solvent. The purification through addition of alcohol and centrifugation may be carried out multiple times as appropriate. As the alcohol to be used for purification, a lower alcohol, such as methanol, ethanol, or n-propanol may be used. When the precipitate is dissolved in an organic solvent, a halogen solvent, such as chloroform; an aromatic hydrocarbon solvent, such as toluene; or an aliphatic hydrocarbon solvent, such as cyclohexane, hexane, pentane, or octane may be used as the organic solvent.

When drying the semiconductor nanoparticles after purifying them, the drying may be carried out by drying under reduced pressure, or natural drying, or by a combination of drying under reduced pressure and natural drying. The natural drying may be carried out, for example, by leaving the particles in the atmosphere at a normal temperature and a normal pressure. In that case, the particles may be left for 20 hours or more, for example, for about 30 hours.

The semiconductor nanoparticles that undergo the shell formation step are prepared in the form of a fluid dispersion in which the particles are dispersed in an appropriate solvent, and a semiconductor layer to serve as the shell is formed in the fluid dispersion. In the fluid in which the semiconductor nanoparticles are dispersed, no scattering of light occurs, and thus the fluid dispersion is typically transparent (colored or colorless). The solvent in which the semiconductor nanoparticles are dispersed is not particularly limited, and any organic solvent may be used as in the preparation of the semiconductor nanoparticles. The organic solvent may be a surface modifier, or a solution containing a surface modifier. For example, the organic solvent may be at least one selected from nitrogen-containing compounds having a hydrocarbon group with a carbon number of from 4 to 20, or at least one selected from sulfur-containing compounds having a hydrocarbon group with a carbon number of from 4 to 20, or a combination of at least one selected from nitrogen-containing compounds having a hydrocarbon group with a carbon number of from 4 to 20 and at least one selected from sulfur-containing compounds having a hydrocarbon group with a carbon number of from 4 to 20, which are those described as the other surface modifiers with regard to the shell. The nitrogen-containing compound preferably has a higher boiling point than the reaction temperature, and specific examples of the organic solvent include oleylamine, n-tetradecylamine, dodecanethiol, and combinations of these.

The fluid dispersion of the semiconductor nanoparticles may be prepared to have a rate of the particles in the fluid dispersion of, for example, from 0.02% by mass to 1% by mass, and particularly from 0.1% by mass to 0.6% by mass. When the rate of the particles in the fluid dispersion is 0.02% by mass or more, collection of products in the aggregation-precipitation process in the poor solvent tends to be easy. When it is 1% by mass or less, Ostwald ripening and fusion by collision of the core materials are reduced, and the particle size distribution tends to be narrow.

Shell Formation Step

The formation of a semiconductor layer to serve as the shell is carried out by adding a compound containing a Group 13 element, and a Group 16 element in the form of a single substance or a compound containing a Group 16 element into the above fluid dispersion. The compound containing a Group 13 element serves as a source of the Group 13 element, and examples include organic salts, inorganic salts, and organic metal compounds of Group 13 elements. Specific examples of the compound containing a Group 13 element include organic acid salts, such as acetate; inorganic acid salts, such as nitrate, sulfate, hydrochloride, and sulfonate; and organic metal compounds, such as an acetylacetonate complex, and the compound is preferably an organic acid salt, such as acetate, or an organic metal compound. An organic acid salt and an organic metal compound are highly soluble in an organic solvent, and tend to cause the reaction to proceed more uniformly.

A Group 16 element in the form of a single substance or a compound containing a Group 16 element serves as a source of Group 16 element. For example, when sulfur (S) is chosen as a Group 16 element for a constituent element of the shell, a sulfur in the form of a single substance, such as high-purity sulfur, may be used. Alternatively, a sulfur-containing compound, for example, a thiol, such as n-butanethiol, isobutanethiol, n-pentanethiol, n-hexanethiol, octanethiol, decanethiol, dodecanethiol, hexadecanethiol, or octadecanethiol, a disulfide, such as dibenzyldisulfide, or, thiourea, 1,3-dimethyl thiourea, or a thiocarbonyl compound may be used.

When oxygen (O) is chosen as a Group 16 element for a constituent element of the shell, alcohol, ether, carboxylic acid, ketone, or an N-oxide compound may be used as a source of Group 16 element. When selenium (Se) is chosen as a Group 16 element for a constituent element of the shell, selenium in the form of a single substance, or a compound, such as phosphine selenium oxide, an organic selenium compound (dibenzyl diselenide or diphenyl diselenide) or its hydrides may be used as a source of Group 16 element. When tellurium (Te) is chosen as a Group 16 element for a constituent element of the shell, tellurium in the form of a single substance, phosphine tellurium oxide, or its hydrides may be used as a source of Group 16 element.

The technique of adding a Group 13 element source and a Group 16 element source to the fluid dispersion is not particularly limited. For example, a Group 13 element source and a Group 16 element source may be dispersed or dissolved in an organic solvent to prepare a mixture solution, and the mixture solution may be added in small portions, for example, dropwise to the fluid dispersion. In this case, the mixture solution may be added at a rate of from 0.1 mL/h to 10 mL/h, and particularly from 1 mL/h to 5 mL/h. The mixture solution may be added to the fluid dispersion that has been heated. Specifically, the shell layer may be formed by the technique of, for example, raising the temperature of the fluid dispersion to a peak temperature of from 200° C. to 290° C., and, after the peak temperature is reached, adding the mixture solution dropwise while maintaining the temperature, and then decreasing the temperature (slow injection technique). The peak temperature may be maintained as appropriate even after completion of the addition of the mixture solution.

When the peak temperature is 200° C. or more, the surface modifier modifying the semiconductor nanoparticles sufficiently detaches, and the chemical reaction for generating the shell sufficiently proceeds, and, mainly for these reasons, the formation of the semiconductor layer (shell) tends to proceed sufficiently. When the peak temperature is 290° C. or less, the semiconductor nanoparticles tend to have less changes in quality, and a band-edge emission by the shell formation tends to be sufficiently obtained. The time during which the peak temperature is maintained, or the retention time of the peak temperature, since the start of the addition of the mixture solution may be from 1 min to 300 min, and particularly from 10 min to 60 min in total. The retention time of the peak temperature may be selected in relation to the peak temperature. When the peak temperature is lower, the retention time is extended, and when the peak temperature is higher, the retention time is shortened. This can form a suitable shell layer. The rate at which the temperature is raised and the rate at which the temperature is decreased are not particularly limited. After the peak temperature is maintained for a predetermined time, the temperature may be decreased, for example, by stopping the heating source (for example, an electric heater) and releasing the heat.

Alternatively, a Group 13 element source and a Group 16 element source may be all added directly to the fluid dispersion. The fluid dispersion to which the Group 13 element source and the Group 16 element source have been added is then heated to form a semiconductor layer, or a shell, on the surfaces of the semiconductor nanoparticles (heating-up technique). Specifically, the fluid dispersion to which a Group 13 element source and a Group 16 element source have been added may be heated by the technique of, for example, slowly heating the dispersion to reach a peak temperature of from 200° C. to 290° C., and, after maintaining the peak temperature for from 1 min to 300 min, slowly decreasing the temperature of the dispersion. The rate at which the temperature is raised may be, for example, from 1° C./min to 50° C./min, and the rate at which the temperature is decreased may be, for example, from 1° C./min to 100° C./min. Alternatively, the rate at which the temperature is raised may not be particularly controlled, and heating may be carried out to reach a predetermined peak temperature, and the rate at which the temperature is decreased may not be constant, and the temperature may be decreased by stopping the heating source and releasing the heat. Also, the temperature may be rapidly decreased by immersing the dispersion in water or in another appropriate liquid. The advantageous effect of setting the peak temperature within a specific range is as described with regard to the addition of the mixture solution.

According to the heating-up technique, core-shell semiconductor nanoparticles that give a stronger band-edge emission than the core-shell semiconductor nanoparticles formed by the slow injection technique tend to be obtained.

In either method of adding a Group 13 element source and a Group 16 element source, their charge ratio preferably corresponds to the stoichiometric composition ratio of the compound semiconductor that contains the Group 13 element and the Group 16. For example, when an In source is used as a Group 13 element source and an S source as a Group 16 element source, the charge ratio is preferably 1:1.5 (In: S) corresponding to the composition $In_2S_3$. Similarly, when a Ga source is used as a Group 13 element source and an S source as a Group 16 element, the charge ratio is preferably 1:1.5 (Ga:S) corresponding to the composition $Ga_2S_3$. However, their charge ratio may not necessarily be a stoichiometric composition ratio, and when raw materials are initially used in an excess amount over the target production amount of the shell, for example, the Group 16 element source may be used less than the stoichiometric composition ratio to have an charge ratio of, for example, 1:1 (Group 13:Group 16).

To form shells with a desired thickness on the semiconductor nanoparticles in the fluid dispersion, the charge amounts may be selected considering the amount of the semiconductor nanoparticles contained in the fluid dispersion. For example, the charge amounts of a Group 13 element source and a Group 16 element source may be determined to produce a compound semiconductor composed of the Group 13 element and the Group 16 element and having a stoichiometric composition of from 0.01 mmol to 10 mmol, and particularly from 0.1 mmol to 1 mmol relative to 10 nmol in an amount-of-substance in terms of particles of the semiconductor nanoparticles; provided, however, that the amount-of-substance in terms of particles refers to the amount by mole when each single particle is regarded as a huge molecule, and is equal to a value obtained by dividing the number of the nanoparticles contained in the fluid dispersion by Avogadro's number ($N_A$=6.022×10$^{23}$).

In the production method, it is preferable to use indium acetate or gallium acetylacetonate as a Group 13 element source, sulfur in the form of a single substance, thiourea, or 1,3-dimethyl thiourea as a Group 16 element source, and n-tetradecylamine or oleylamine as a fluid dispersion to form a shell containing indium sulfide or gallium sulfide.

In the heating-up technique, using 1,3-dimethyl thiourea as a Group 16 element source (sulfur source) tends to allow sufficient formation of a shell and production of semiconductor nanoparticles that give a strong band-edge emission. When sulfur in the form of a single substance is used to form a shell, a longer retention time of the peak temperature after it is reached (for example, 40 min or more, particularly 50 min or more, with an upper limit of, for example, 60 min or less) tends to produce semiconductor nanoparticles with a strong band-edge emission. In the heating-up technique where sulfur in the form of a single substance is used, a longer retention time enables production of semiconductor nanoparticles that give an emission spectrum in which the intensity of a broad peak derived from the defect emission is sufficiently smaller than the intensity of a peak from the band-edge emission. Furthermore, regardless of the types of the sulfur source, the longer the retention time, the more the peak of the band-edge emission emitted from the resulting semiconductor nanoparticles tends to shift toward longer wavelengths. Further, in the heating-up technique, using n-tetradecylamine as the fluid dispersion enables production of semiconductor nanoparticles that give an emission spectrum in which the intensity of a broad peak derived from the defect emission is sufficiently smaller than the intensity of a peak from the band-edge emission. These tendencies are significantly recognized when a gallium source is used as a Group 13 element source.

The shell is formed in this manner to form core-shell particles. The resulting core-shell particles may be separated from the solvent, or may be further purified and dried as appropriate. The separation, purification, and drying techniques are as described previously in relation to the semiconductor nanoparticles, and thus the detailed descriptions thereof are omitted here.

Modification Step

In the modification step, the prepared core-shell particles and a compound containing a Group 15 element that contains P with a negative oxidation number (the specific modifier) may be contacted to modify the shell surfaces of the core-shell particles. This enables production of core-shell semiconductor nanoparticles that exhibit a band-edge emission with a superior quantum yield.

The contact between the core-shell semiconductor nanoparticles and the specific modifier may be carried out, for example, by mixing the fluid dispersion of the core-shell semiconductor nanoparticles and the specific modifier. The contact may also be carried out by mixing the core-shell particles with the specific modifier in the form of a liquid. For the specific modifier, a solution of the specific modifier may be used. The fluid dispersion of the core-shell semiconductor nanoparticles may be obtained by mixing the core-shell semiconductor nanoparticles and an appropriate organic solvent. Examples of the organic solvent for use for the dispersion include halogen solvents, such as chloroform; aromatic hydrocarbon solvents, such as toluene; and aliphatic hydrocarbon solvents, such as cyclohexane, hexane, pentane, and octane. The concentration of the amount-of-substance of the core-shell semiconductor nanoparticles in the fluid dispersion is, for example, from $1 \times 10^{-7}$ mol/L to $1 \times 10^{-3}$ mol/L, and preferably from $1 \times 10^{-6}$ mol/L to $1 \times 10^{-4}$ mol/L.

The amount of the specific modifier relative to the core-shell semiconductor nanoparticles used is, for example, from 1 to 50,000 times by mole ratio. When the core-shell semiconductor nanoparticles in the fluid dispersion have a concentration of the amount-of-substance of from $1.0 \times 10^{-7}$ mol/L to $1.0 \times 10^{-3}$ mol/L, the fluid dispersion and the specific modifier may be mixed in a volume ratio of from 1:1000 to 1000:1.

The temperature at which the core-shell semiconductor nanoparticles and the specific modifier are contacted is, for example, from $-100°$ C. to $100°$ C. or from $-30°$ C. to $75°$ C. The duration of contact may be selected appropriately in accordance with, for example, the use amount of the specific modifier and the concentration of the fluid dispersion. The duration of contact is, for example, 1 min or more, and preferably 1 hour or more, and 100 hours or less, and preferably 48 hours or less. The atmosphere during contact is, for example, an inert gas atmosphere, such as nitrogen gas or a rare gas.

The method of producing core-shell semiconductor nanoparticles may further include, in addition to the core-shell particle preparation step and the modification step, after-treatment steps, such as separation, purification, and drying as appropriate.

Light-Emitting Device

The light-emitting device includes a light conversion member and a semiconductor light-emitting element, and the light conversion member includes the core-shell semiconductor nanoparticles described above. The light-emitting device, for example, allows the core-shell semiconductor nanoparticles to absorb a part of light emitted by the semiconductor light-emitting element, and emit light with a longer wavelength. The light from the core-shell-structured semiconductor nanoparticles and light from the semiconductor light-emitting element are mixed, and the mixed light can be used as light emitted by the light-emitting device.

Specifically, using a semiconductor light-emitting element that emits bluish-violet light or blue light with a peak wavelength of from about 400 nm to 490 nm, and the core-shell semiconductor nanoparticles that absorb blue light and emit yellow light can produce a light-emitting device that emits white light. Alternatively, using two types of the core-shell semiconductor nanoparticle: those that absorb blue light and emit green light, and those that absorb blue light and emit red light can also produce a white light-emitting device.

Alternatively, using a semiconductor light-emitting element that emits ultraviolet rays with a peak wavelength of 400 nm or less, and three types of the core-shell semiconductor nanoparticles that absorb ultraviolet rays, and respectively emit blue light, green light, and red light can also produce a white light-emitting device. In this case, the light emitted from the light-emitting element is preferably all absorbed by the semiconductor nanoparticles to prevent ultraviolet rays emitted by the light-emitting element from leaking outside.

Alternatively, using one that emits blue-green light with a peak wavelength of about 490 nm to 510 nm, and using the core-shell semiconductor nanoparticles that absorb this blue-green light and emit red light can produce a white light-emitting device.

Alternatively, using a semiconductor light-emitting element that emits red light with a wavelength of from 700 nm to 780 nm, and using the core-shell semiconductor nanoparticles that absorb red light and emit near-infrared rays can produce a light-emitting device that emits near-infrared rays.

The core-shell semiconductor nanoparticles may be used in combination with other semiconductor quantum dots, or may be used in combination with other non-quantum dot fluorescent materials (for example, organic fluorescent materials or inorganic fluorescent materials). Examples of the other semiconductor quantum dots include binary semiconductor quantum dots as described in the column of Background Art. As a non-quantum dot fluorescent material, a garnet fluorescent material, such as aluminum garnet fluorescent material may be used. Examples of the garnet fluorescent material include cerium-activated yttrium-aluminum-garnet fluorescent materials and cerium-activated lutetium-aluminum-garnet fluorescent materials. Other usable examples include europium- and/or chromium-activated nitrogen-containing calcium aluminosilicate fluorescent materials, europium-activated silicate fluorescent materials, β-SiAlON fluorescent materials, nitride fluorescent materials, such as CASN or SCASN-based ones, rare-earth nitride fluorescent materials, such as $LnSi_3N_{11}$ or LnSiAlON-based ones, oxynitride fluorescent materials, such as $BaSi_2O_2N_2$:Eu or $Ba_3Si_6O_{12}N_2$:Eu-based ones, sulfide fluorescent materials, such as CaS, $SrGa_2S_4$, $SrAl_2O_4$, and ZnS-based ones, chlorosilicate fluorescent materials, $SrLiAl_3N_4$:Eu fluorescent materials, $SrMg_3SiN_4$:Eu fluorescent materials, and $K_2SiF_6$:Mn fluorescent material, which is a manganese-activated fluoride complex fluorescent material.

In the light-emitting device, the light conversion member containing the core-shell semiconductor nanoparticles may be, for example, a sheet member or a plate member, or a three-dimensional member. An example of the three-dimensional member is, in a surface-mount light-emitting diode in which a semiconductor light-emitting element is disposed on the bottom surface of a recess defined in the package, a sealing member formed of a resin that is filled into the recess to seal the semiconductor light-emitting element.

Another example of the light conversion member is, in the case where a semiconductor light-emitting element is disposed on a planar substrate, a resin member formed in a manner to surround the top surface and side surfaces of the semiconductor light-emitting element with a substantially uniform thickness. A still another example of the light conversion member is, in the case where a resin member containing a reflective material is filled in the surroundings of a semiconductor light-emitting element such that its top end forms a same plane with the semiconductor light-emitting element, a plane-shaped resin member with a predetermined thickness formed on the semiconductor light-emitting element and the resin member containing the reflective material.

The light conversion member may be in contact with the semiconductor light-emitting element, or may be arranged apart from the semiconductor light-emitting element. Specifically, the light conversion member may be a member in the form of a pellet, a sheet, a plate, or a rod arranged apart from the semiconductor light-emitting element, or a member arranged in contact with the semiconductor light-emitting element, such as a sealing member, a coating member (a member covering the light-emitting element arranged independently from a mold member), or a mold member (including, for example, a lens-shaped member).

In the light-emitting device, when two or more types of the core-shell semiconductor nanoparticles that emit light with different wavelengths are used, the two or more types of the core-shell semiconductor nanoparticles may be mixed in a single light conversion member, or two or more light conversion members each containing a single type of quantum dots alone may be used in combination. In this case, the two or more light conversion members may form a laminated structure, or may be arranged as a pattern in the form of dots or stripes on a plane.

An example of the semiconductor light-emitting element is an LED chip. The LED chip may include a semiconductor layer composed of one or two or more selected from the group including GaN, GaAs, InGaN, AlInGaP, GaP, SiC, and ZnO. A semiconductor light-emitting element that emits bluish-violet light, blue light, or ultraviolet rays includes a semiconductor layer composed of, for example, a GaN compound having a composition represented by $In_XAl_YGa_{1-X-Y}N$ ($0 \leq X$, $0 \leq Y$, $X+Y<1$).

The light-emitting device of the present embodiment is preferably incorporated as a light source in a liquid crystal display. The band edge emission by the core-shell semiconductor nanoparticles has a short emission lifetime. Thus, a light emitting device containing the core-shell semiconductor nanoparticles is suitable as a light source for a liquid crystal display that needs a relatively quick response speed. Also, the core-shell semiconductor nanoparticles according to the present embodiment can exhibit a band-edge emission having an emission peak with a small half bandwidth. Thus, without using a thick-color filter, a liquid crystal display can have a good color reproducibility by including a light emitting device that includes:

a blue semiconductor light-emitting element that emits blue light with a peak wavelength in the range of 420 nm to 490 nm, the core-shell semiconductor nanoparticles that emit green light with a peak wavelength in the range of from 510 nm to 550 nm, and preferably from 530 nm to 540 nm, and the core-shell semiconductor nanoparticles that emit red light with a peak wavelength in the range of from 600 nm to 680 nm, and preferably from 630 nm to 650 nm; or, a semiconductor light-emitting element that emits an ultraviolet light with a peak wavelength of 400 nm or less, the core-shell semiconductor nanoparticles that emit blue light with a peak wavelength in the range of from 430 nm to 470 nm, and preferably from 440 nm to 460 nm, the core-shell semiconductor nanoparticles that emit green light with a peak wavelength in the range of from 510 nm to 550 nm, and preferably from 530 nm to 540 nm, and the core-shell semiconductor nanoparticles that emit red light with a peak wavelength in the range of from 600 nm to 680 nm, and preferably from 630 nm to 650 nm. The light emitting device may be used, for example, as a direct back light, or an edge backlight.

Alternatively, a sheet formed from, for example, glass or resin, a plate, or a rod containing the core-shell semiconductor nanoparticles may be incorporated as a light conversion member independently from the light-emitting device in a liquid crystal display.

EXAMPLES

The present invention will now be described specifically by means of

Examples; however, the present invention is not limited to these Examples.

Example 1

Synthesis of Semiconductor Nanoparticles

In a reaction vessel, 0.4 mmol of silver acetate (AgOAc) and 0.4 mmol of indium acetate ($In(OAc)_3$) were mixed with 8 mL of a distillation-purified oleylamine, and dodecanethiol (1.25 mmol, 300 µL) was added with stirring. The synthesis solution was degassed, purged with an argon atmosphere, and heated to about 70° C., and, with the lid being opened temporarily, a crystal of thiourea (0.8 mmol, 60.8 mg) was added to obtain a first mixture. This is followed by degassing for a very short time, and the temperature was raised at a rate of 30° C./min until it reached 130° C. After the actual measurement reached 130° C., heat treatment was continued for 600 sec. The reaction vessel was then immersed in water at room temperature, and quenched (during quench, the temperature was decreased at a rate of about 50° C./min on average) to halt synthesis. After removal of coarse particles by centrifugation, methanol was added to the supernatant to precipitate semiconductor nanoparticles that serve as the core, which were collected by centrifugation. The collected solid was dispersed in 2 mL of oleylamine.

For the resultant semiconductor nanoparticles, the XRD pattern was measured, and compared with tetragonal $AgInS_2$ (chalcopyrite-type), hexagonal $AgInS_2$ (wurtzite-type), and orthorhombic $AgInS_2$. The measured XRD pattern is shown in FIG. 1. The XRD pattern has no peak at around 48°, which is observed for hexagonal and orthorhombic crystals, so that the semiconductor nanoparticles were confirmed to have a crystal structure essentially approximately the same as tetragonal $AgInS_2$. The XRD pattern was measured using a powder X-ray diffractometer (trade name: SmartLab) by Rigaku.

The shapes of the resultant semiconductor nanoparticles were observed using a transmission electron microscope (TEM, trade name: H-7650 by Hitachi High-Technologies), and the average particle diameter was measured using a TEM image captured at a magnification of from 80000 to 200000×. As a TEM grid, one with a trade name of High Resolution Carbon: HRC-C10 STEM Cu 100P grid (by Okenshoji) was used. The resultant particles were spherical or polygonal. The average particle diameter was obtained by choosing TEM images captured at least three different sites, measuring and averaging the particle diameters of all the countable nanoparticles, in other words, excluding partially cut particles along the edges of the images among the nanoparticles contained in these sites. In all Examples including the present Example and Comparative Examples, the particle diameters of at least 100 nanoparticles in total were measured using three or more TEM images. The average particle diameter of the semiconductor nanoparticles was 4.17 nm.

Subsequently, the amount-of-substance of indium contained in the resultant semiconductor nanoparticles was measured using an ICP emission spectrophotometer (ICPS-7510 by Shimadzu) to be 41.5 μmol.

The semiconductor nanoparticles with an average particle diameter of 4.17 nm are calculated to have a volume of 37.95 nm$^3$ when they are assumed to be spherical. A silver indium sulfide crystal when it is tetragonal is calculated to have a unit lattice volume of 0.38 nm$^3$ (lattice constants: 5.828 Å (0.5828 nm), 5.828 Å (0.5828 nm), and 11.19 Å (1.119 nm)), and thus by dividing the volume of the semiconductor nanoparticles by the unit lattice volume, the semiconductor nanoparticles are calculated to have 100 unit lattices per nanoparticle. A silver indium sulfide crystal when it is tetragonal contains four indium atoms per unit lattice, and thus the nanoparticles are calculated to contain 400 indium atoms per nanoparticle. By dividing the amount-of-substance of indium with the number of indium atoms per nanoparticle, the amount-of-substance, in terms of nanoparticles, of the semiconductor nanoparticles is calculated to be 104 nmol.

Synthesis of Core-Shell Semiconductor Nanoparticles 0.1 mmol of gallium acetylacetonate (Ga(acac)$_3$) and 0.1 mmol of 1,3-dimethyl thiourea were measured, and 8 mL of distillation-purified oleylamine and 0.5 mL of the oleylamine dispersion of the semiconductor nanoparticles synthesized above (the amount-of-substance in terms of nanoparticles was 30 nmol) were added to obtain a second mixture. The solution was degassed at around 60° C., and the temperature was then raised at a rate of 60° C./min until it reached 230° C. After reaching 230° C., the temperature was raised at a rate of 2° C./min until it reached 280° C., and heat treatment was carried out for 30 min at 280° C. The temperature was then decreased under room temperature to 150° C., at which vacuuming was carried out once to remove volatile components, such as hydrogen sulfide. When the temperature became 100° C. or less, the flask was immersed in water to quench it to room temperature. Methanol was added to precipitate core-shell particles, and after washing, the resultant core-shell semiconductor nanoparticles were dispersed in chloroform (4 mL).

For the resultant core-shell semiconductor nanoparticles, the average particle diameter and XRD were measured in the same manner as for the semiconductor nanoparticles above. The measured XRD pattern is shown in FIG. 1. The core-shell semiconductor nanoparticles had an average particle diameter of 5.38 nm. The XRD pattern has no peak at around 48°, which is observed for hexagonal and orthorhombic crystals, so that the semiconductor nanoparticles were found to have a structure essentially approximately the same as tetragonal AgInS$_2$.

Modification Step

A 2-mL aliquot was taken from the chloroform dispersion of the resultant core-shell semiconductor nanoparticles, and 2 mL of trioctylphosphine (TOP) was added. After mixing by shaking at room temperature for 10 min, the mixture was left to stand at room temperature for 24 hours to obtain a fluid dispersion of semiconductor nanoparticles, or TOP-modified core-shell particles.

Measurement of Absorption and Emission Spectra and Quantum Yields

Figure 2:
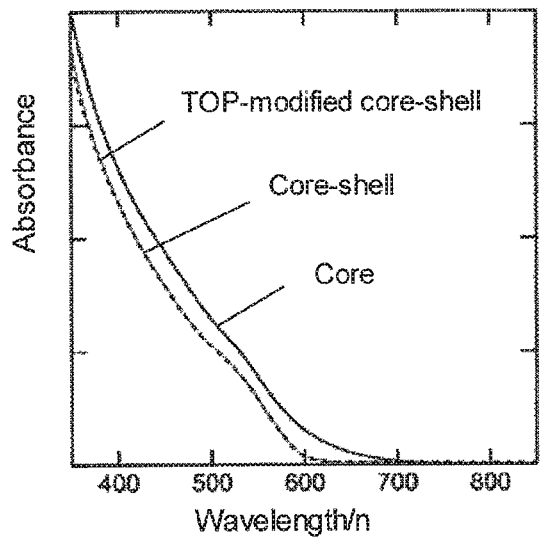
FIG. 2 shows absorption spectra of the semiconductor nanoparticles (core), the core-shell semiconductor nanoparticles (core-shell), and the TOP-modified core-shell semiconductor nanoparticles produced in Example 1.
Figure 3:
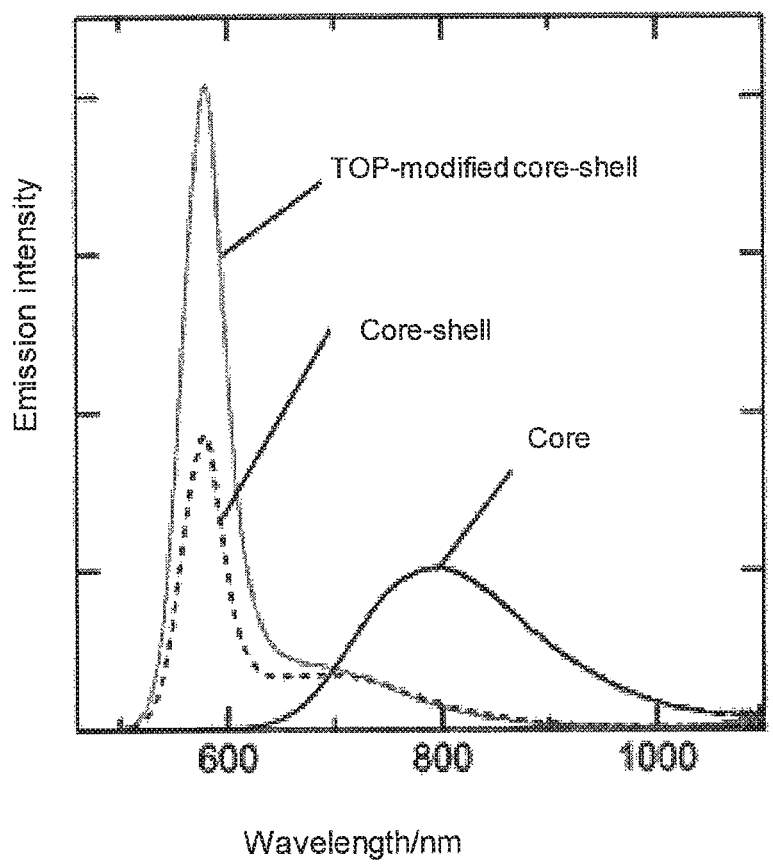
FIG. 3 shows emission spectra of the semiconductor nanoparticles (core), the core-shell semiconductor nanoparticles (core-shell), and the TOP-modified core-shell semiconductor nanoparticles produced in Example 1.

The absorption and emission spectra of the semiconductor nanoparticles, the core-shell semiconductor nanoparticles, and the TOP-modified core-shell semiconductor nanoparticles were measured. The results are shown in FIGS. 2 and 3. The absorption spectra were each measured using a UV-Vis-NIR spectrophotometer (trade name: V-670 by JASCO) in the wavelength range of from 350 nm to 850 nm. The emission spectra were each measured using a multi-channel photodetector (trade name: PMA12 by Hamamatsu Photonics) at an excitation wavelength of 450 nm. The quantum yields were each measured using a fluorescent spectrum measuring device (PMA-12 by Hamamatsu Photonics) equipped with an integrating sphere at room temperature (25° C.) and at an excitation wavelength of 450 nm in the wavelength range of from 350 nm to 1100 nm, and calculated in the wavelength range of from 506 nm to 882 nm.

As shown in FIG. 2, the absorption spectrum of the core-shell semiconductor nanoparticles has a slight shoulder at around 500 nm, and there is substantially no absorption at around 600 nm or more, which allows an inference that there is an exciton peak at from around 400 nm to 600 nm. As shown in FIG. 3, a band-edge emission with a half-bandwidth of about 44 nm is observed at around 577 nm. The band-edge emission had a quantum yield of 12.3%, the purity of the band-edge emission component was 44.4%, and the band-edge emission had an intensity ratio of 0.81.

As shown in FIG. 2, the absorption spectrum of the TOP-modified core-shell semiconductor nanoparticles has a slight shoulder at around 500 nm, and there is substantially no absorption at around 600 nm or more, which allows an inference that there is an exciton peak at from around 400 nm to 600 nm. As shown in FIG. 3, a band-edge emission with a half-bandwidth of about 46 nm is observed at around 579 nm. The band-edge emission had a quantum yield of 31.7%, the purity of the band-edge emission component was 67.1%, and the band-edge emission had an intensity ratio of 0.89.

For each of the emissions observed as band-edge emissions of the core-shell semiconductor nanoparticles and the TOP-modified core-shell semiconductor nanoparticles, the emission lifetime was measured. The measurement of the emission lifetime was carried out using a fluorescence lifetime measuring device by Hamamatsu Photonics (trade name: Quantaurus-Tau) by irradiating the core-shell-structured semiconductor nanoparticles with light at a wavelength of 470 nm as excitation light to obtain an attenuation curve at around the peak wavelength of the band-edge emission peak. The resultant attenuation curve was divided into three components through parameter fitting using a fluorescence lifetime measurement/analysis software U11487-301 by Hamamatsu Photonics. The results, $\tau_1$, $\tau_2$, and $\tau_3$, and the respective contribution ratio of these components ($A_1$, $A_2$, and $A_3$) are shown in Table 1 below. Non-TOP modified refers to the non-TOP modified core-shell semiconductor nanoparticles, and TOP-modified refers to the TOP-modified core-shell semiconductor nanoparticles.

TABLE 1

|  | $\tau_1$ (ns) | $A_1$ (%) | $\tau_2$ (ns) | $A_2$ (%) | $\tau_3$ (ns) | $A_3$ (%) |
| --- | --- | --- | --- | --- | --- | --- |
| Non-TOP modified | 2.34 | 48 | 44.6 | 44 | 138 | 8 |
| TOP-modified | 15.5 | 35 | 63 | 62 | 298 | 3 |

As shown in Table 1, the main component ($\tau_2$, $A_2$) of the core-shell semiconductor nanoparticles (non-TOP modified) had 44.6 ns, and the main component ($\tau_2$, $A_2$) of the TOP-modified core-shell semiconductor nanoparticles (TOP-modified) had 63.0 ns. These emission lifetimes are about the same as the fluorescence lifetime (from 30 ns to 60 ns) of the component with the largest contribution ratio of fluorescence emitted from CdSe (nanoparticles), whose band-edge emission has been confirmed.

Analysis by Energy Dispersive X-Ray Analyzer

The atomic percentage of each element contained in the TOP-modified core-shell semiconductor nanoparticles was analyzed using an energy dispersive X-ray analyzer (trade name: OCTANE by EDAX). The results are shown in Table 2. As shown in Table 2, the TOP-modified core-shell semiconductor nanoparticles were confirmed to contain P. Assuming that the composition of the core was AgInS2 and the composition of the shell was GaS, the atomic percentage of sulfur calculated from the results for Ag and Ga in Table 2 was 49.4% (13.4×2+22.6/1×1=49.4), showing a good match with the value of S in Table 2.

TABLE 2

| Ag | In | Ga | S | P |
| --- | --- | --- | --- | --- |
| 13.4% | 14.4% | 22.6% | 45.7% | 3.9% |

Comparative Example 1

To the semiconductor nanoparticles (core) synthesized in the same manner as in Example 1 and dispersed in 2 mL of oleylamine, 2 mL of trioctylphosphine (TOP) was added. After mixing by shaking at room temperature for 10 min, the mixture was left to stand at room temperature for 24 hours to obtain a fluid dispersion of TOP-modified semiconductor nanoparticles. For the semiconductor nanoparticles and the resultant TOP-modified semiconductor nanoparticles, emission spectra were measured as in Example 1. The respective results are shown in FIG. 4.

Figure 4:
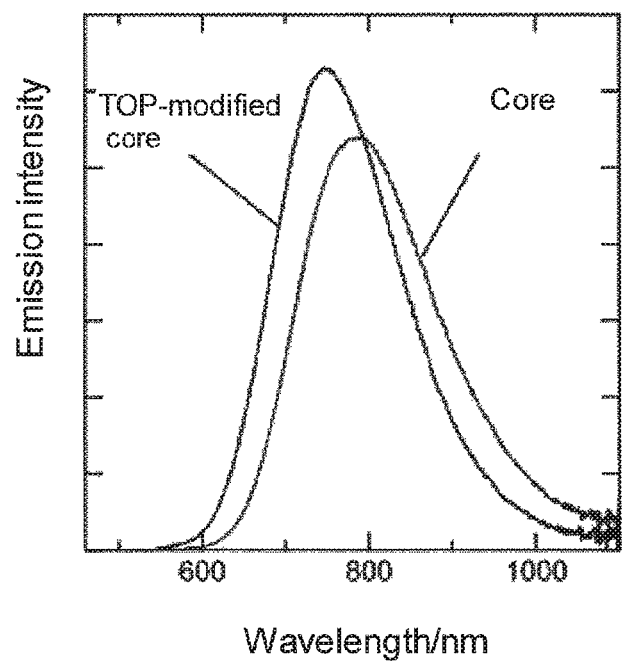
FIG. 4 shows emission spectra of the semiconductor nanoparticles (core) and the TOP-modified core semiconductor nanoparticles produced in Comparative Example 1.

As shown in FIG. 4, the TOP-modified semiconductor nanoparticles showed no band-edge emission but a broad emission.

Example 2

Synthesis of Semiconductor Nanoparticles

In a reaction vessel, 0.4 mmol of AgOAc, 0.16 mmol of In(acac)$_3$, 0.24 mmol of Ga(acac)$_3$, and 11.8 mL of oleylamine were mixed, and dodecanethiol (0.83 mmol, 200 μL) was added. The synthesis solution was degassed and purged with a nitrogen atmosphere, the temperature was raised to about 50° C. with a hot-water bath, and, with the lid being temporarily open, thiourea (0.8 mmol, 60.8 mg) was added to obtain a first mixture. This is followed by degassing for a very short time, and after nitrogen was introduced again, the temperature was raised at a rate of 10° C./min until it reached 150° C. After the actual measurement reached 150° C., heat treatment was continued for 600 sec. The reaction vessel was then immersed in hot water at about 50° C., and quenched (at a temperature decreasing rate of about 90° C./min for immediately after the start of quench, and thereafter at about 37° C./min on average until it reached 60° C.) to halt synthesis. After removal of coarse particles by centrifugation, methanol was added to the supernatant to precipitate semiconductor nanoparticles that serve as the core. The precipitate was washed once with methanol, vacuum-dried for 30 min, and dispersed in 5 mL of hexane.

Synthesis of Core-Shell Semiconductor Nanoparticles 0.1 mmol of Ga(acac)$_3$ and 0.15 mmol of 1,3-dimethyl thiourea were measured, and 7.79 g of tetradecylamine and 3.3 mL of the hexane dispersion of the semiconductor nanoparticles synthesized above (the amount-of-substance in terms of nanoparticles was about 60 nmol) were added to obtain a second mixture. The reaction vessel was degassed, and after introduction of nitrogen, stirring was started, and the temperature was raised to about 50° C. with a hot-water bath to melt tetradecylamine. The temperature was then raised at a rate of 10° C./min until it reached 270° C., and heat treatment was carried out at 270° C. for 60 min. Subsequently, the temperature was decreased to 100° C. under room temperature, and vacuuming was carried out once to remove volatile components, such as hydrogen sulfide. When the temperature was further decreased to about 60° C., 3 mL of hexane was added to the reaction solution to reduce solidification of tetradecylamine. The contents were taken out, and coarse particles were precipitation-separated by centrifugation. To the supernatant, methanol was then added to precipitate core-shell particles, the precipitate was washed once with methanol, and the resultant core-shell particles were then dispersed in hexane (3 mL).

Measurement of Absorption and Emission Spectra and Quantum Yields

Figure 5:
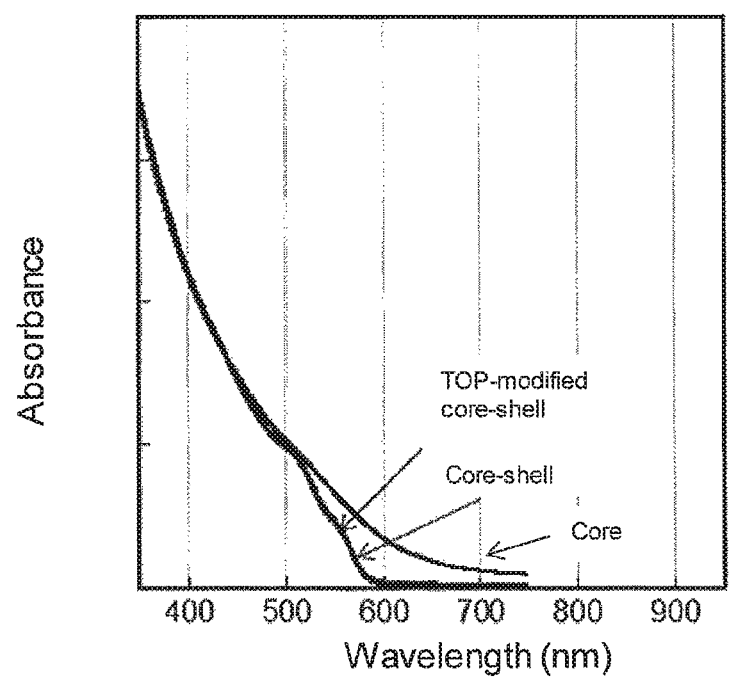
FIG. 5 shows absorption spectra of the semiconductor nanoparticles (core), the core-shell semiconductor nanoparticles (core-shell), and the TOP-modified core-shell semiconductor nanoparticles produced in Example 2.
Figure 6:
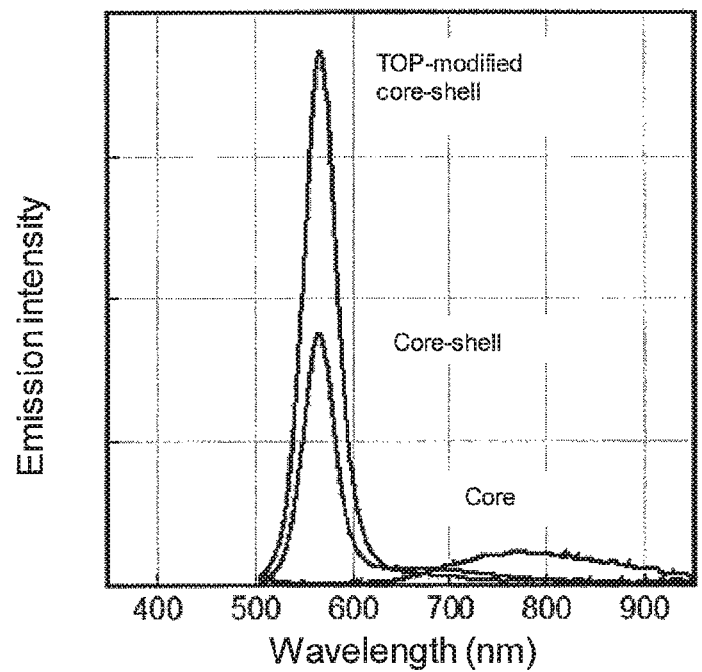
FIG. 6 shows emission spectra of the semiconductor nanoparticles (core), the core-shell semiconductor nanoparticles (core-shell), and the TOP-modified core-shell semiconductor nanoparticles produced in Example 2.

The absorption and emission spectra of the core-shell semiconductor nanoparticles were measured. The results are shown in FIGS. 5 and 6. The absorption spectra were measured using a UV-Vis-NIR spectrophotometer (trade name: U-2900 by Hitachi High-Technologies) in the wavelength range of from 350 nm to 750 nm. The emission spectra were each measured using a Quantum Efficiency Measurement System (trade name: QE-2100 by Otsuka Electronics) at room temperature (25° C.) and at an excitation wavelength of 450 nm. The quantum yield was calculated from the spectra measured with the same device in the wavelength range of from 506 nm to 882 nm.

As shown in FIG. 5, the absorption spectrum of the core-shell semiconductor nanoparticles has a shoulder at around 500 nm, and there is substantially no absorption at around 600 nm or more, which allows an inference that there is an exciton peak at from around 400 nm to 600 nm. As shown in FIG. 6, a band-edge emission with a half-bandwidth of about 36 nm is observed at around 567 nm, and the quantum yield of the band-edge emission was 23.6%. The purity of the band-edge emission component was 69.5%, and the intensity ratio of the band-edge emission was 0.93.

1.5 mL of the hexane dispersion of the resultant core-shell semiconductor nanoparticles was taken in a test tube, and after evaporation and removal of hexane in a nitrogen stream, 1.5 mL of chloroform was added. To this, the same amount of trioctylphosphine (TOP) was added, and the top portion of the test tube was filled with nitrogen, and the test tube was hermetically sealed, and stirred at room temperature for 24 hours to obtain a fluid dispersion of TOP-modified core-shell semiconductor nanoparticles.

For the resultant TOP-modified core-shell semiconductor nanoparticles, the quantum yield and the emission spectrum were measured. As shown in FIG. 5, the absorption spectrum of the TOP-modified core-shell semiconductor nanoparticles has a shoulder at around 500 nm, and there is substantially no absorption at around 600 nm or more, which allows an inference that there is an exciton peak at from around 400 nm to 600 nm. As shown in FIG. 6, a band-edge emission with a half-bandwidth of about 39 nm is observed at around 569 nm, and the quantum yield of the band-edge emission was 51.8%. The purity of the band-edge emission component was 83.1%, and the intensity ratio of the band-edge emission was 0.95.

By TOP-modifying the core-shell semiconductor nanoparticles that exhibit a band-edge emission, the quantum yield of the emission, particularly the quantum yield of the band-edge emission is improved.

The disclosure of Japanese Patent Application No. 2018-025409 (filing date: Feb. 15, 2018) is incorporated herein by reference in its entirety. All pieces of the literature, the patent applications, and the technical standards described in the present specification are incorporated herein by reference to the same extent that each of these pieces of literature, each of these patent applications, and each of these technical standards are specifically and individually described to be incorporated herein by reference.

The invention claimed is:

1. Core-shell semiconductor nanoparticles, each comprising:
a core; and
a shell disposed on a surface of the core, and emitting light when irradiated with light,
wherein the core consists of a semiconductor having a composition represented by the formula $M^1M^2Z_2$, $M^1$ being Ag, $M^2$ consisting of at least one selected from the group consisting of Ga and In, and Z consisting of at least one selected from the group consisting of S and Se,
the shell contains a semiconductor consisting of Ga and S, and having a greater band-gap energy than the core, and
a compound containing a Group 15 element is disposed on an outer surface of the shell, the Group 15 element containing at least P with a negative oxidation number, and
wherein the core has a chalcopyrite-type crystal structure,
wherein the compound containing the Group 15 element is a shell surface modifier having a hydrocarbon group with a carbon number of from 4 to 20.

2. The core-shell semiconductor nanoparticles according to claim 1, wherein the shell contains Ga as the Group 13 element, and wherein the shell contains S as the Group 16 element.

3. The core-shell semiconductor nanoparticles according to claim 1, wherein the core contains S as Z.

4. The core-shell semiconductor nanoparticles according claim 1, having an emission spectrum including a peak with a half-bandwidth of 70 nm or less.

5. The core-shell semiconductor nanoparticles according to claim 1, having an emission lifetime of 200 ns or less.

6. The core-shell semiconductor nanoparticles according to claim 1, having an excitation spectrum or an absorption spectrum with an exciton peak.

7. The core-shell semiconductor nanoparticles according to claim 1, having a band-edge emission component with a purity of 40% or more over an entire emission spectrum.

8. The core-shell semiconductor nanoparticles according to claim 1, having a band-edge emission component with a purity of 40% or more over an entire emission spectrum, and a quantum yield of 10% or more.

9. A method of producing core-shell semiconductor nanoparticles that emit light when irradiated with light, the method comprising:
providing core-shell particles each containing a core and a shell disposed on a surface of the core; and
contacting the core-shell particles and a compound containing a Group 15 element,
wherein the core consists of a semiconductor having a composition represented by the formula $M^1M^2Z_2$, $M^1$ being Ag, $M^2$ consisting of at least one selected from the group consisting of Al, Ga and In, and Z consisting of at least one selected from the group consisting of S and Se,
the shell contains a semiconductor consisting of Ga and S, and having a greater band-gap energy than the core, and
the Group 15 element contains at least P with a negative oxidation number, and
wherein the core has a chalcopyrite-type crystal structure,
wherein the compound containing the Group 15 element is a shell surface modifier having a hydrocarbon group with a carbon number of from 4 to 20.

10. A light-emitting device, comprising:
a light conversion member; and
a semiconductor light-emitting element,
wherein the light conversion member contains the core-shell semiconductor nanoparticles according to claim 1.

11. The light-emitting device according to claim 10, wherein the semiconductor light-emitting element is an LED chip.

12. The core-shell semiconductor nanoparticles according to claim 1, wherein the compound containing the Group 15 element includes at least one selected from the group consisting of tributylphosphine, triisobutylphosphine, tripentylphosphine, trihexylphosphine, trioctylphosphine, tris(ethylhexyl)phosphine, tridecylphosphine, tridodecylphosphine, tritetradecylphosphine, trihexadecylphosphine, trioctadecylphosphine, triphenylphosphine, tributylphosphine oxide, triisobutylphosphine oxide, tripentylphosphine oxide, trihexylphosphine oxide, trioctylphosphine oxide, tris(ethylhexyl)phosphine oxide, tridecylphosphine oxide, tridodecylphosphine oxide, tritetradecylphosphine oxide, trihexadecylphosphine oxide, trioctadecylphosphine oxide, and triphenylphosphine oxide.

13. The method according to claim 9, wherein the compound containing the Group 15 element includes at least one selected from the group consisting of tributylphosphine, triisobutylphosphine, tripentylphosphine, trihexylphosphine, trioctylphosphine, tris(ethylhexyl)phosphine, tridecylphosphine, tridodecylphosphine, tritetradecylphosphine, trihexadecylphosphine, trioctadecylphosphine, triphenylphosphine, tributylphosphine oxide, triisobutylphosphine oxide, tripentylphosphine oxide, trihexylphosphine oxide, trioctylphosphine oxide, tris(ethylhexyl)phosphine oxide, tridecylphosphine oxide, tridodecylphosphine oxide, tritetradecylphosphine oxide, trihexadecylphosphine oxide, trioctadecylphosphine oxide, and triphenylphosphine oxide.

14. The Core-shell semiconductor nanoparticles according to claim 1, wherein the compound containing the Group 15 element is disposed only on an outer surface of the shell.

* * * * *